(12) United States Patent
Kim et al.

(10) Patent No.: US 10,700,203 B2
(45) Date of Patent: Jun. 30, 2020

(54) SEMICONDUCTOR DEVICES

(71) Applicant: Samsung Electronics Co., Ltd., Suwon-si, Gyeonggi-do (KR)

(72) Inventors: Dong Woo Kim, Incheon (KR); Do Hee Kim, Seoul (KR); Hyo Jin Kim, Hwaseong-si (KR); Kang Hun Moon, Incheon (KR); Si Hyung Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/213,186

(22) Filed: Dec. 7, 2018

(65) Prior Publication Data
US 2019/0393347 A1 Dec. 26, 2019

(30) Foreign Application Priority Data
Jun. 20, 2018 (KR) .................. 10-2018-0070878

(51) Int. Cl.
*H01L 29/78* (2006.01)
*H01L 21/02* (2006.01)
*H01L 29/08* (2006.01)
*H01L 29/165* (2006.01)
*H01L 29/417* (2006.01)
(Continued)

(52) U.S. Cl.
CPC ...... *H01L 29/7848* (2013.01); *H01L 21/0245* (2013.01); *H01L 21/02532* (2013.01); *H01L 21/02636* (2013.01); *H01L 21/308* (2013.01); *H01L 21/30604* (2013.01); *H01L 21/76224* (2013.01); *H01L 21/823418* (2013.01); *H01L 21/823431* (2013.01); *H01L 21/823481* (2013.01); *H01L 27/0886* (2013.01); *H01L 29/0653* (2013.01); *H01L 29/0847* (2013.01); *H01L 29/165* (2013.01); *H01L 29/36* (2013.01); *H01L 29/41791* (2013.01);
(Continued)

(58) Field of Classification Search
CPC .......... H01L 29/41791; H01L 29/7848; H01L 29/66636; H01L 29/4236; H01L 29/42372; H01L 29/7397; H01L 29/7813; H01L 29/66666; H01L 29/66909; H01L 21/823431; H01L 21/823487; H01L 21/823821; H01L 21/02532; H01L 27/0886; H01L 27/0924; H01L 29/7788; H01L 29/7827
See application file for complete search history.

(56) References Cited
U.S. PATENT DOCUMENTS
8,659,032 B2  2/2014  Chao et al.
9,666,691 B2  5/2017  Su et al.
(Continued)

Primary Examiner — Hsien Ming Lee
(74) Attorney, Agent, or Firm — Myers Bigel, P.A.

(57) ABSTRACT

A semiconductor device includes a plurality of active fins on a substrate, a gate electrode intersecting the plurality of active fins, and a source/drain region on the plurality of active fins, extending on a first side and a second side of the gate electrode. The source/drain region includes lower epitaxial layers on ones of the plurality of active fins. The lower epitaxial layers include germanium (Ge) having a first concentration. An upper epitaxial layer is on the lower epitaxial layers, and includes germanium (Ge) having a second concentration that is higher than the first concentration. The lower epitaxial layers have convex upper surfaces, and are connected to each other between the active fins.

20 Claims, 12 Drawing Sheets

(51) Int. Cl.
*H01L 29/45* (2006.01)
*H01L 29/36* (2006.01)
*H01L 29/06* (2006.01)
*H01L 21/8234* (2006.01)
*H01L 21/308* (2006.01)
*H01L 21/762* (2006.01)
*H01L 29/66* (2006.01)
*H01L 21/306* (2006.01)
*H01L 27/088* (2006.01)

(52) U.S. Cl.
CPC ........ *H01L 29/45* (2013.01); *H01L 29/66545* (2013.01); *H01L 29/66636* (2013.01)

(56) References Cited

U.S. PATENT DOCUMENTS

| | | |
|---|---|---|
| 9,728,645 B2 | 8/2017 | Kim et al. |
| 9,761,719 B2 * | 9/2017 | Kim .................. H01L 29/7848 |
| 9,768,178 B2 | 9/2017 | Lee et al. |
| 9,793,404 B2 | 10/2017 | Sung et al. |
| 9,831,345 B2 | 11/2017 | Yu et al. |
| 2009/0184341 A1 | 7/2009 | Chong et al. |
| 2011/0121363 A1 | 5/2011 | Cheng et al. |
| 2011/0278646 A1 | 11/2011 | Ng et al. |
| 2017/0098648 A1 | 4/2017 | Lee et al. |

* cited by examiner

IV-IV'

SEMICONDUCTOR DEVICES

CROSS-REFERENCE TO RELATED APPLICATION(S)

This application claims priority under 35 U.S.C. § 119 to Korean Patent Application No. 10-2018-0070878 filed on Jun. 20, 2018 in the Korean Intellectual Property Office, the disclosure of which is incorporated by reference herein in its entirety.

BACKGROUND

The present inventive concept relates to a semiconductor device. As demand for high performance, high speed, and/or multifunctionality in semiconductor devices has increased, the degree of integration of semiconductor devices has increased. When a semiconductor device having a fine pattern corresponding to a high integration trend of a semiconductor device is manufactured, it may be necessary to implement patterns having a fine width or a fine separation distance. Moreover, in order to overcome the limitation of element characteristics of a planar metal oxide semiconductor FET (MOSFET), a semiconductor device including a FinFET having a channel with a three-dimensional structure has been developed.

SUMMARY

Some embodiments of the present inventive concept provide a semiconductor device having low contact resistance, and having a low change in contact resistance and a low change in performance.

According to example embodiments of the present inventive concept, a semiconductor device includes a plurality of active fins on a substrate, a gate electrode intersecting the plurality of active fins, and a source/drain region on the plurality of active fins, extending on a first side and a second side of the gate electrode. The source/drain region includes lower epitaxial layers and an upper epitaxial layer. The lower epitaxial layers are on the plurality of active fins, and include germanium (Ge) having a first concentration. The upper epitaxial layer is on the lower epitaxial layers, and includes germanium (Ge) having a second concentration that is higher than the first concentration. The lower epitaxial layers have convex upper surfaces, and are connected to each other in between the active fins.

According to example embodiments of the present inventive concept, a semiconductor device includes a plurality of active fins on a substrate, a gate electrode intersecting the plurality of active fins, and a source/drain region on the plurality of active fins, on a first side and a second side of the gate electrode. The source/drain region includes first epitaxial layers, second epitaxial layers, third epitaxial layers, and a fourth epitaxial layer. The first epitaxial layers are on ones of the plurality of active fins, and include germanium (Ge) having a first concentration. The second epitaxial layers are on the first epitaxial layers, and include germanium (Ge) having a second concentration that is higher than the first concentration. The third epitaxial layers are on the second epitaxial layers, and include germanium (Ge) having a third concentration that is higher than the second concentration. The fourth epitaxial layer includes germanium (Ge) having a fourth concentration that is higher than the third concentration and covers the third epitaxial layers. The third epitaxial layers have convex upper surfaces, and are connected to each other in between ones of the plurality of active fins.

According to example embodiments of the present inventive concept, a semiconductor device includes a plurality of active fins on a substrate, a gate electrode intersecting the plurality of active fins, a source/drain region on ones of the plurality of active fins on a first side and a second side of the gate electrode, and a contact plug on the source/drain region. The source/drain region includes first epitaxial layers, second epitaxial layers, third epitaxial layers, and a fourth epitaxial layer. The first epitaxial layers are on ones of the plurality of active fins, and include germanium (Ge) having a first concentration. The second epitaxial layers are on the first epitaxial layers, and include germanium (Ge) having a second concentration that is higher than the first concentration. The third epitaxial layers are on the second epitaxial layers, and include germanium (Ge) having a third concentration that is higher than the second concentration. The fourth epitaxial layer includes germanium (Ge) having a fourth concentration that is higher than the third concentration and covers the third epitaxial layers. The third epitaxial layers have convex upper surfaces, and are connected to each other in a position between ones of the plurality of active fins, and the contact plug is in contact with the fourth epitaxial layer.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

Hereinafter, the example embodiments of the present disclosure will be described in detail with reference to the attached drawings.

Figure 1:
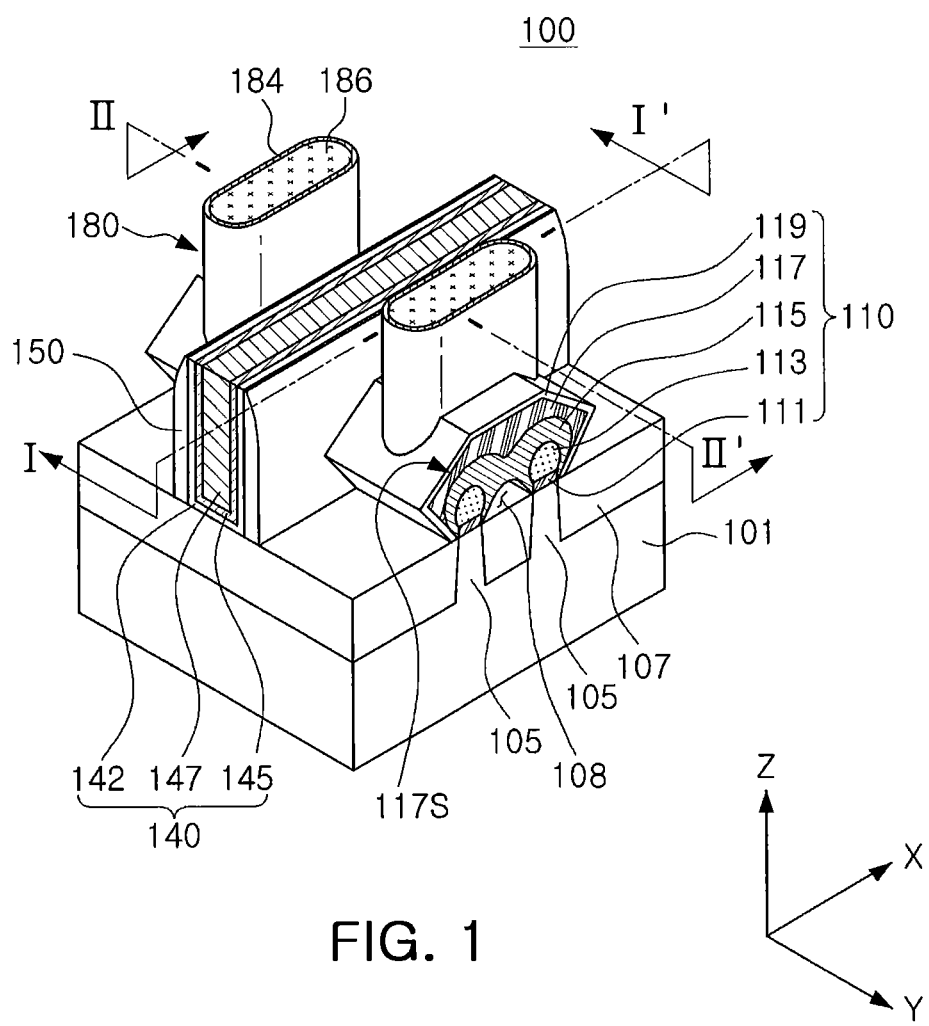
FIG. 1 is a perspective view illustrating a semiconductor device according to some embodiments.
Figure 2A:
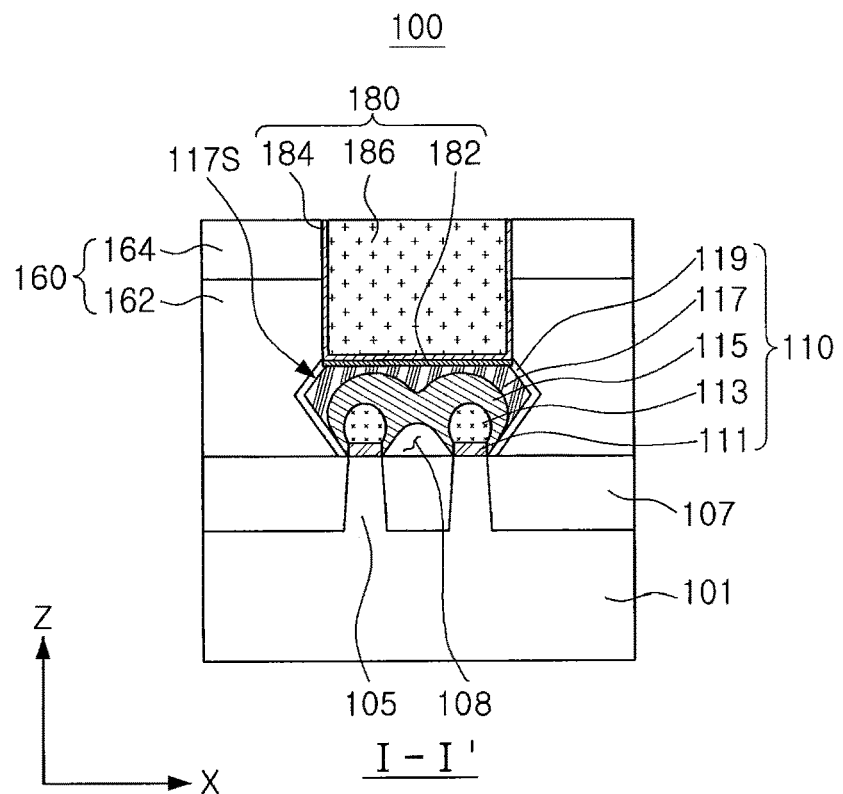
FIGS. 2A and 2B are cross-sectional views illustrating the semiconductor device of FIG. 1 cut along lines I-I' and II-II', respectively, according to some embodiments.
Figure 2B:
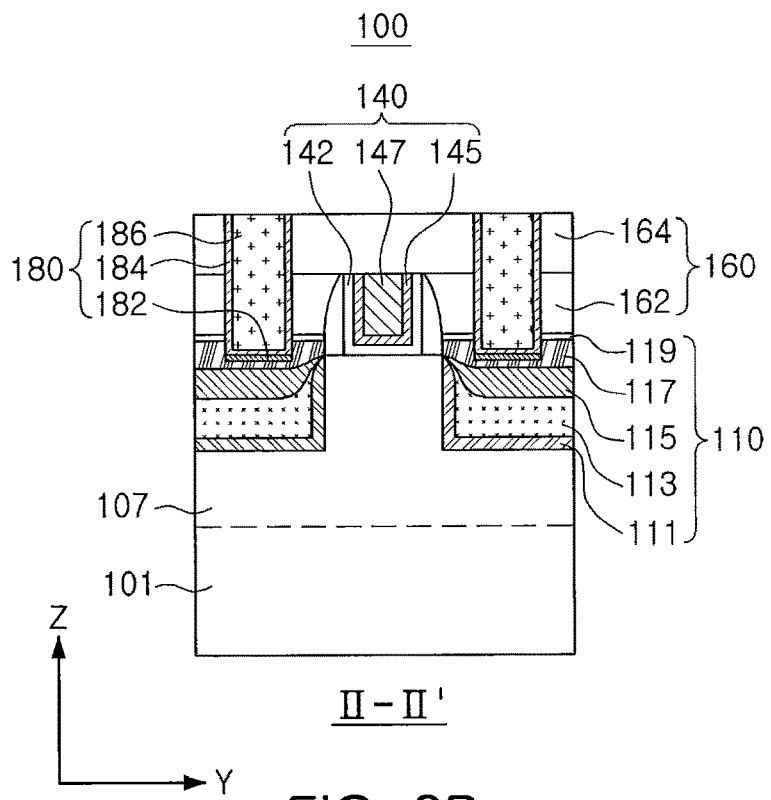

FIG. 1 is a perspective view illustrating a semiconductor device according to an example embodiment. FIGS. 2A and 2B are cross-sectional views illustrating the semiconductor device of FIG. 1 cut along lines I-I' and II-II'. For convenience of explanation, only main components are illustrated in FIG. 1, and interlayer insulating layer 160 of FIGS. 2A and 2B is omitted from FIG. 1.

Referring to FIGS. 1 to 2B, a semiconductor device 100 may include a substrate 101, active fins 105, source/drain regions 110, a gate structure 140, and contact plugs 180. The semiconductor device 100 may further include element isolation layers 107, a spacer 150, and an interlayer insulating layer 160.

The semiconductor device 100 according to example embodiments may be a FinFET, a field effect transistor, in which the active fins 105 have a fin shape.

The substrate 101 may have an upper surface extended in an X-direction and a Y-direction. The substrate 101 may include a semiconductor material, for example, a Group IV semiconductor, a Group III-V compound semiconductor, or a Group II-VI compound semiconductor. For example, the Group IV semiconductor may include silicon, germanium, or silicon-germanium. The substrate 101 may be provided as a single crystal silicon wafer, a silicon-on-insulator (SOI) substrate, or the like.

The element isolation layers 107 may define the active fins 105 in the substrate 101 and may separate fins 105 from one another. The element isolation layers 107 may be formed of an insulating material. The element isolation layers 107 may be formed using, for example, a shallow trench isolation (STI) process. The element isolation layers 107 may include, for example, an oxide, a nitride, or a combination thereof.

The active fins 105 may be defined by the element isolation layers 107 in the substrate 101, and may be disposed to be extended in a first direction, for example, the Y-direction. The active fins 105 may have a fin shape, protruding from the substrate 101. The active fins 105 may be formed of a portion of the substrate 101, and may include an epitaxial layer grown from the substrate 101.

The source/drain regions 110 may be disposed on the active fins 105, on both sides of the gate structure 140. The source/drain regions 110 may be an embedded source/drain disposed in a region, from which a portion of the active fins 105 on the substrate 101 is removed, on both sides of the gate structure 140. The source/drain regions 110 may be provided as a source region or a drain region of the semiconductor device 100.

The source/drain regions 110 may have a connected or merged structure on two active fins 105. However, the number of active fins 105, connected, is not limited to that illustrated in the drawings. In example embodiments, the source/drain regions 110 may have a connected or merged structure on three or more active fins 105.

The source/drain regions 110 may include, for example, silicon or silicon germanium (SiGe). For example, when the source/drain regions 110 include silicon germanium (SiGe), compressive stress may be applied to a channel region, a region of the active fin 105 formed of silicon (Si), such that mobility of a hole may be improved.

The source/drain regions 110 may include a plurality of epitaxial layers. Each of the source/drain regions 110 may include first epitaxial layers 111, second epitaxial layers 113, third epitaxial layers 115, and a fourth epitaxial layer 117, including germanium (Ge) which may have different concentrations from one another. The source/drain regions 110 may further include a capping layer 119 covering the fourth epitaxial layer 117.

The first epitaxial layers 111 are disposed on the active fins 105, respectively, while the second epitaxial layers 113 may be disposed on the first epitaxial layers 111, respectively. The third epitaxial layers 115 are disposed on the second epitaxial layers 113, and the third epitaxial layers 115 may have a convex upper surface. The third epitaxial layers 115 may be connected to each other on the element isolation layer 107 between neighboring active fins 105. In some embodiments, the third epitaxial layers 115 may be connected to each other to provide a single epitaxial region.

The fourth epitaxial layer 117 is disposed on the third epitaxial layers 115, and may have inclined side surfaces 117S with respect to an upper surface of the substrate 101. The side surfaces 117S of the fourth epitaxial layer 117 may correspond to a crystallographic plane. For example, when the fourth epitaxial layer 117 is formed of silicon germanium (SiGe), the side surfaces 117S of the fourth epitaxial layer 117 may be a {111} crystal plane. An upper surface of the fourth epitaxial layer 117, located between the side surfaces 117S, may be a flat surface.

An air gap 108 may be provided between the source/drain regions 110 and the element isolation layer 107 in a position between neighboring active fins 105.

The first epitaxial layer 111, the second epitaxial layers 113, the third epitaxial layers 115, and the fourth epitaxial layer 117 may include elements and/or doping elements, having different concentrations from one another.

For example, the first epitaxial layers 111 may include germanium (Ge) having a first concentration, the second epitaxial layers 113 may include germanium (Ge) having a second concentration, higher than the first concentration, and the third epitaxial layers 115 may include germanium (Ge) having a third concentration, higher than the second concentration. The fourth epitaxial layer 117 may include germanium (Ge) having a fourth concentration, higher than the third concentration.

The first concentration of germanium may be in a range of 5 at % to 25 at % (atomic percentage), while the second concentration of germanium may be in a range of 25 at % to 45 at %. Moreover, the third concentration of germanium may be in a range of 45 at % to 60 at %, while the fourth concentration of germanium may be in a range of 60 at % to 90 at %.

The first epitaxial layers 111, the second epitaxial layers 113, the third epitaxial layers 115, and the fourth epitaxial layer 117 may include doping elements (impurities), having different concentrations from one another. Boron (B) may be used as a doping element for impurities. For example, the first epitaxial layers 111 may include boron (B) having a first concentration, while the second epitaxial layers 113 may include boron (B) having a second concentration, higher than the first concentration. In addition, the third epitaxial layers 115 may include boron (B) having a third concentration, higher than the second concentration, while the fourth epitaxial layer 117 may include boron (B) having a fourth concentration, higher than the third concentration.

The first epitaxial layers 111, the second epitaxial layers 113, and the third epitaxial layers 115 include germanium (Ge) may have different concentrations, while including respective doping elements having different concentrations. In some embodiments, only one of the concentration of germanium (Ge) or the doping elements may be different.

The capping layer 119 may be disposed to surround an outer surface of the fourth epitaxial layer 117, and the capping layer 119 may protect the fourth epitaxial layer 117 during a subsequent process. The capping layer 119 may be formed of silicon (Si). When the fourth epitaxial layer 117 is formed of silicon germanium (SiGe) having a relatively low melting point, the capping layer 119 is formed of silicon (Si), such that the fourth epitaxial layer 117 may be protected during a subsequent process. In other words, the fourth epitaxial layer 117 may have a lower melting point than that of the capping layer 119.

The gate structure 140 may be disposed to intersect the active fins 105, and may include a gate insulating layer 142, a first gate electrode 145, and a second gate electrode 147. The gate structure 140 may cover an upper surface of the active fins 105. A spacer 150 may be disposed on each of both side surfaces of the gate structure 140.

The gate insulating layer 142 may be disposed between the active fins 105 and the first gate electrode 145 and between the spacer 150 and the first gate electrode 145. The gate insulating layer 142 may include a silicon oxide, a silicon nitride, a silicon oxynitride, or a high-k material. The high-k material may refer to a dielectric material having a dielectric constant, which may be higher than a dielectric constant of a silicon oxide ($SiO_2$) film. The high-k material may be, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$). In example embodiments, the gate insulating layer 142 may be provided on a lower surface of the first gate electrode 145.

The first gate electrode 145 and the second gate electrode 147 may be sequentially disposed on the gate insulating layer 142. The first gate electrode 145 and the second gate electrode 147 may be formed of different materials. The first gate electrode 145 may include, for example, TiN, TaN, WN, WCN, TiAl, TiAlC, TiAlN, or a combination thereof. The second gate electrode 147 may include, for example, a metallic material such as aluminum (Al), tungsten (W), molybdenum (Mo), or the like, or a semiconductor material such as doped polysilicon. In example embodiments, the gate electrode may include a single layer. For example, the second gate electrode 147 may be omitted.

The spacer 150 may allow the source/drain regions 110 to be isolated from the first gate electrode 145 and the second gate electrode 147. The spacer 150 may be formed of, a silicon oxide, a silicon nitride, a silicon oxynitride, a low-k material, or a combination thereof. The spacer 150 may be formed as a single layer film or as a multilayer film. For example, the spacer 150 may have a stacking structure of a silicon nitride and a low-k material. The low-k material may refer to a dielectric material having a dielectric constant, lower than a dielectric constant of a silicon oxide ($SiO_2$) film. The low-k material may include SiCN, SiOC, SiON, SiOCN, or the like.

The contact plugs 180 are disposed on the source/drain regions 110, and may have an elongated shape on a plane. In other words, the contact plugs 180 may have a shape extended in an extending direction of the gate structure 140, that is, an X-direction, and may have a shape such as a rectangle, an ellipse, or the like.

The contact plugs 180 may pass through the first interlayer insulating layer 162 and the second interlayer insulating layer 164 to be connected to the source/drain regions 110. The contact plugs 180 are disposed in a portion in which an upper surface of the source/drain region 110 is etched to a predetermined depth, to be connected to the source/drain region 110.

In example embodiments, a lower end of the contact plugs 180 may be in contact with a fourth epitaxial layer 117 of the source/drain regions 110. Thus, even when a depth at which an upper surface of the source/drain region 110 is etched is different in an operation of forming a contact hole OP for formation of the contact plugs 180 (See FIG. 15), a change in contact resistance between the contact plugs 180 and the source/drain regions 110 may be low or absent. Even when a position of a lower end of the contact plugs 180 is changed, a change in contact resistance between the contact plugs 180 and the source/drain regions 110 may be low or absent. However, in the case of the semiconductor device 400 of FIGS. 17 and 18 as a comparative example, the contact plugs 180 are connected to the third epitaxial layer 415 and the fourth epitaxial layer 417 of the source/drain region 410. Thus, according to a position of a lower end of the contact plugs 180, contact resistance between the contact plugs 180 and the source/drain regions 410 may be changed.

In example embodiments, the contact plugs 180 are connected to the fourth epitaxial layer 117. In this case, when the fourth epitaxial layer 117 includes germanium (Ge) having a high concentration, a height of a Schottky barrier between the contact plugs 180 and the source/drain regions 110 is lowered, so contact resistance between the contact plugs 180 and the source/drain regions 110 may be reduced. Moreover, when the fourth epitaxial layer 117 includes boron (B) having a high concentration, a width of a Schottky barrier between the contact plugs 180 and the source/drain regions 110 is reduced, so contact resistance between the contact plugs 180 and the source/drain regions 110 may be reduced.

The contact plugs 180 may include a silicide layer 182 as well as a first conductive layer 184 and a second conductive layer 186. The silicide layer 182 may be disposed to be in contact with the source/drain region 110. The silicide layer 182 may be a layer in which a portion of the first conductive layer 184 is silicided by the source/drain region 110, or may be omitted according to example embodiments. The silicide layer 182 may be, for example, titanium silicide. The first conductive layer 184 may be formed on an upper portion of the source/drain regions 110 and a side wall of the contact plugs 180. The first conductive layer 184 may include, for example, at least one metal nitride among a titanium nitride (TiN) film, a tantalum nitride (TaN) film, or a tungsten nitride (WN) film. The second conductive layer 186 may include a conductive material such as aluminum (Al), copper (Cu), tungsten (W), molybdenum (Mo), or the like.

The interlayer insulating layer 160 may include a first interlayer insulating layer 162 and a second interlayer insulating layer 164, and may be disposed to cover the substrate 101, the source/drain regions 110, and the gate structure 140. A height of an upper surface of the first interlayer insulating layer 162 may be substantially the same as a height of an upper surface of the gate structure 140. However, the first interlayer insulating layer 162 and the second interlayer insulating layer 164 are layers distinguished in a process, and a relative height and position of an interface are not limited to those illustrated in the drawings. In some example embodiments, the first interlayer insulating layer 162 and the second interlayer insulating layer 164 may be provided as a single layer. The first interlayer insulating layer 162 and the second interlayer insulating layer 164 may be formed of an insulating material. For example, the first interlayer insulating layer 162 may be a tonen silazene (TOSZ) film, while the second interlayer insulating layer 164 may be a tetraethylortho silicate (TEOS) film.

Figure 3:
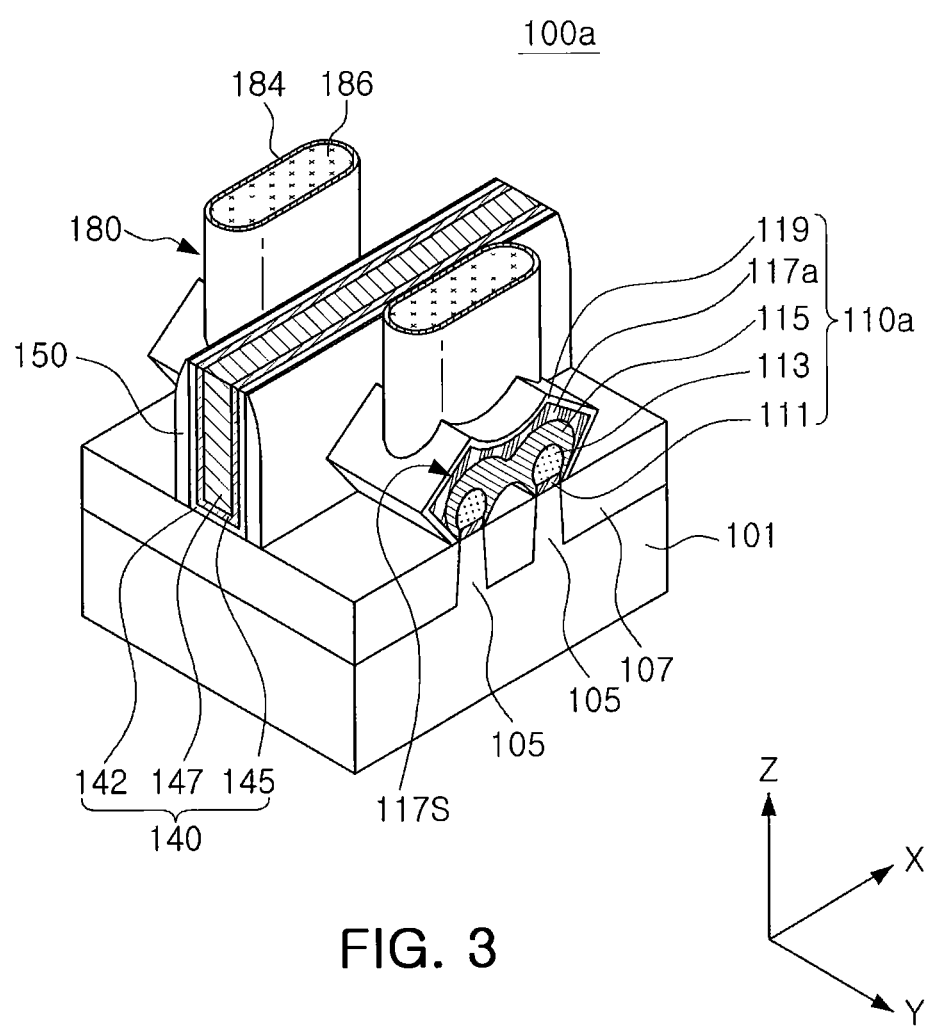
FIGS. 3 to 6 are perspective views illustrating a semiconductor device according to some embodiments.

FIGS. 3 to 6 are perspective views illustrating a semiconductor device according to example embodiments. Referring to FIG. 3, a semiconductor device 100a may include a substrate 101, active fins 105, source/drain regions 110a, a gate structure 140, and contact plugs 180. The semiconductor device 100a may further include element isolation layers 107 and a spacer 150.

Each of the source/drain regions 110a may include first epitaxial layers 111, second epitaxial layers 113, third epitaxial layers 115, and a fourth epitaxial layer 117a, as well as a capping layer 119. In the semiconductor device 100a according to example embodiments, an upper surface of the fourth epitaxial layer 117 located between inclined side surfaces 117S may have a shape which is downwardly concave, in a manner different from the semiconductor device 100 of FIG. 1. The upper surface of the fourth epitaxial layer 117 may be a downwardly concave shape.

Figure 4:
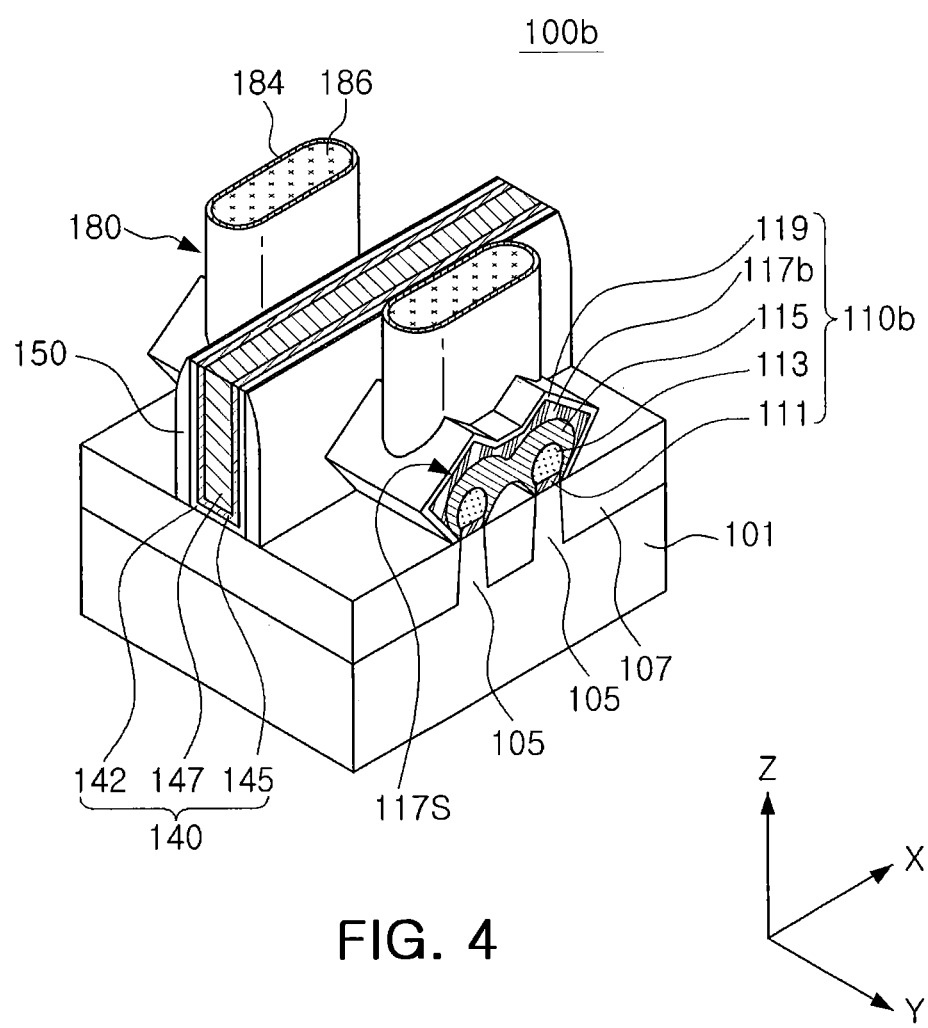

Referring to FIG. 4, a semiconductor device 100b may include a substrate 101, active fins 105, source/drain regions 110b, a gate structure 140, and contact plugs 180. The semiconductor device 100b may further include element isolation layers 107 and a spacer 150.

Each of the source/drain regions 110b may include first epitaxial layers 111, second epitaxial layers 113, third epitaxial layers 115, and a fourth epitaxial layer 117b, as well as a capping layer 119. In the semiconductor device 100b according to example embodiments, an upper surface of the fourth epitaxial layer 117 located between inclined side surfaces 117S may have a groove, in a manner different from the semiconductor device 100 of FIG. 1. Side surfaces of the groove may be inclined with respect to an upper surface of the substrate 101.

Figure 5:
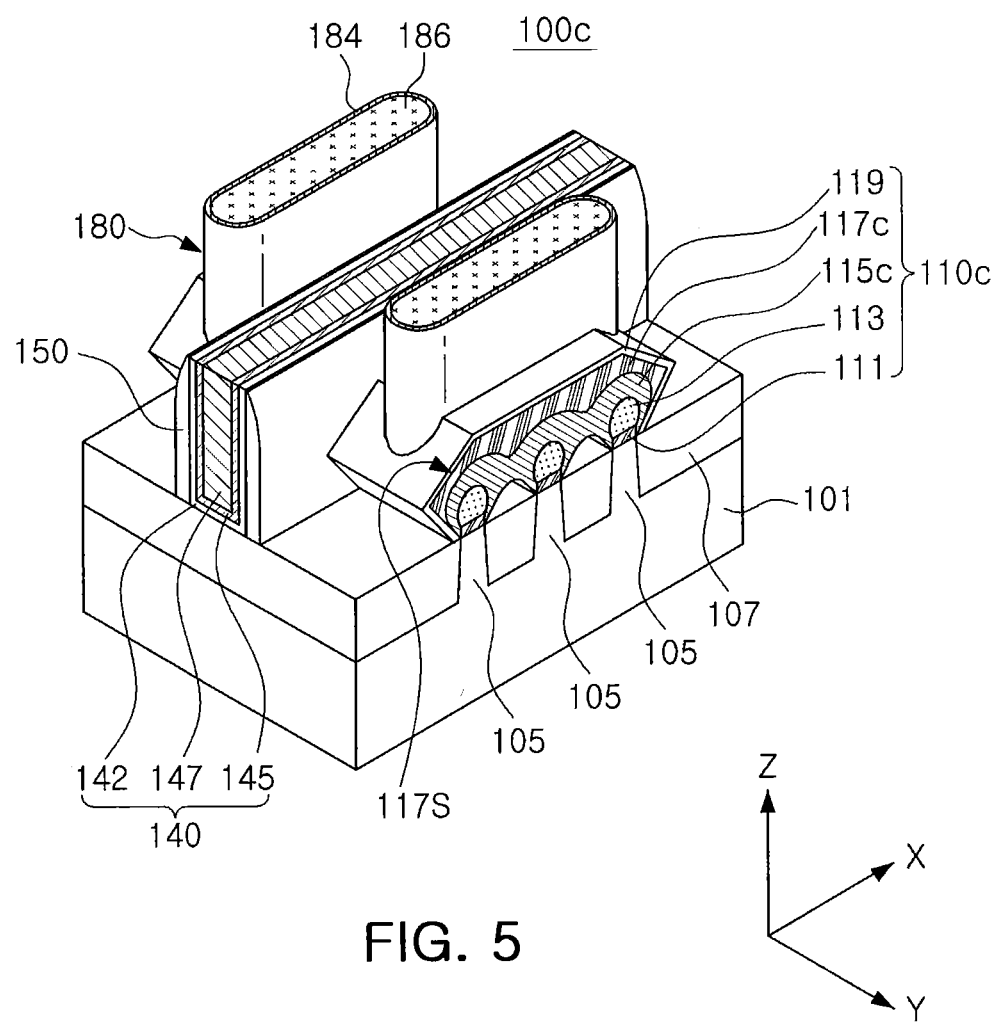

Referring to FIG. 5, a semiconductor device 100c may include a substrate 101, active fins 105, source/drain regions 110c, a gate structure 140, and contact plugs 180. The semiconductor device 100c may further include element isolation layers 107 and a spacer 150.

The source/drain regions 110c may be disposed to be connected on three active fins 105. Each of the source/drain regions 110c may include first epitaxial layers 111, second epitaxial layers 113, third epitaxial layers 115c, and a fourth epitaxial layer 117c, as well as a capping layer 119.

The third epitaxial layers 115c, formed on the three active fins 105, are connected to each other to form a single third epitaxial layer. The fourth epitaxial layer 117c may cover the third epitaxial layers 115c, and may have inclined side surfaces 117S. The fourth epitaxial layer 117c may have a flat upper surface located between the inclined side surfaces 117S. In example embodiments, the upper surface of the fourth epitaxial layer 117c may have curvature in a downwardly concave form, in a position between the active fins 105 in a manner similar to that illustrated in FIG. 3. In example embodiments, the upper surface of the fourth epitaxial layer 117c may have grooves, in a position between the active fins 105 in a manner similar to that illustrated in FIG. 4.

Figure 6:
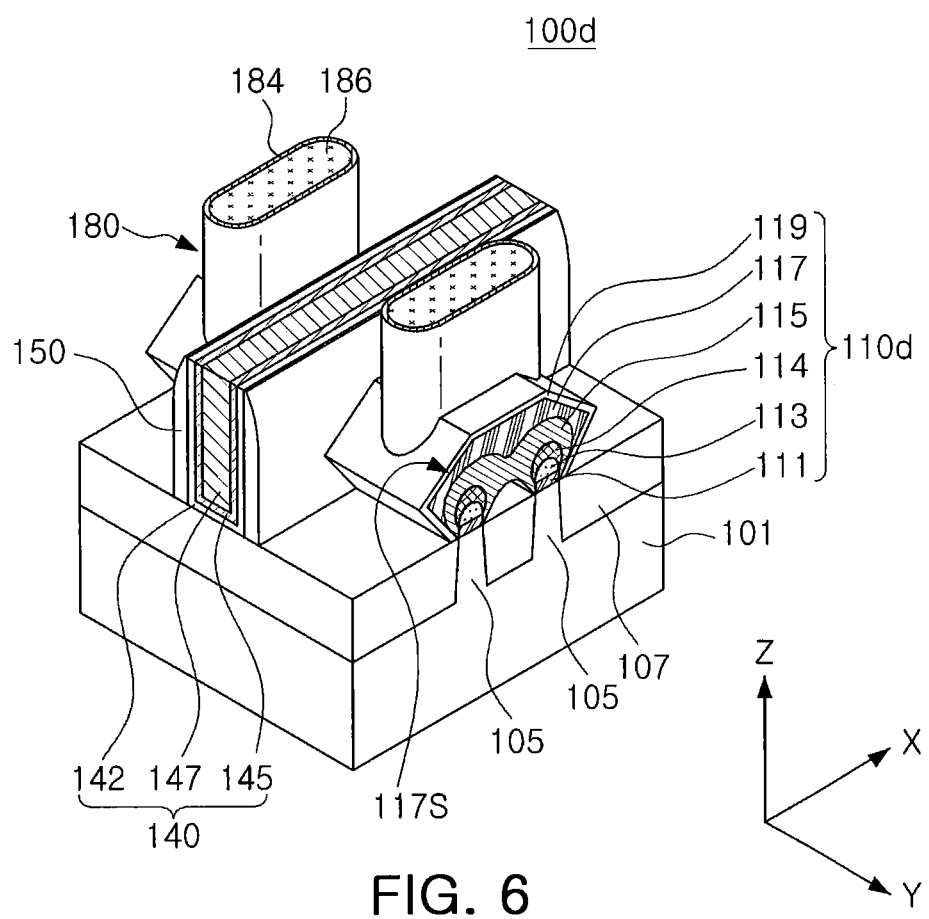

Referring to FIG. 6, a perspective view, a semiconductor device 100d may include a substrate 101, active fins 105, source/drain regions 110d, a gate structure 140, and contact plugs 180. The semiconductor device 100d may further include element isolation layers 107 and a spacer 150.

Each of the source/drain regions 110d may further include fifth epitaxial layers 114, in addition to first epitaxial layers 111, second epitaxial layers 113, third epitaxial layers 115, and a fourth epitaxial layer 117. The fifth epitaxial layer 114 may be disposed between the second epitaxial layer 113 and the third epitaxial layer 115, and may include germanium (Ge) having a concentration different from that of the second epitaxial layer 113 and the third epitaxial layer 115. For example, the fifth epitaxial layer 114 may include germanium (Ge) having a fifth concentration, greater than a second concentration of the second epitaxial layer 113 and less than a third concentration of the third epitaxial layer 115.

Figure 13:
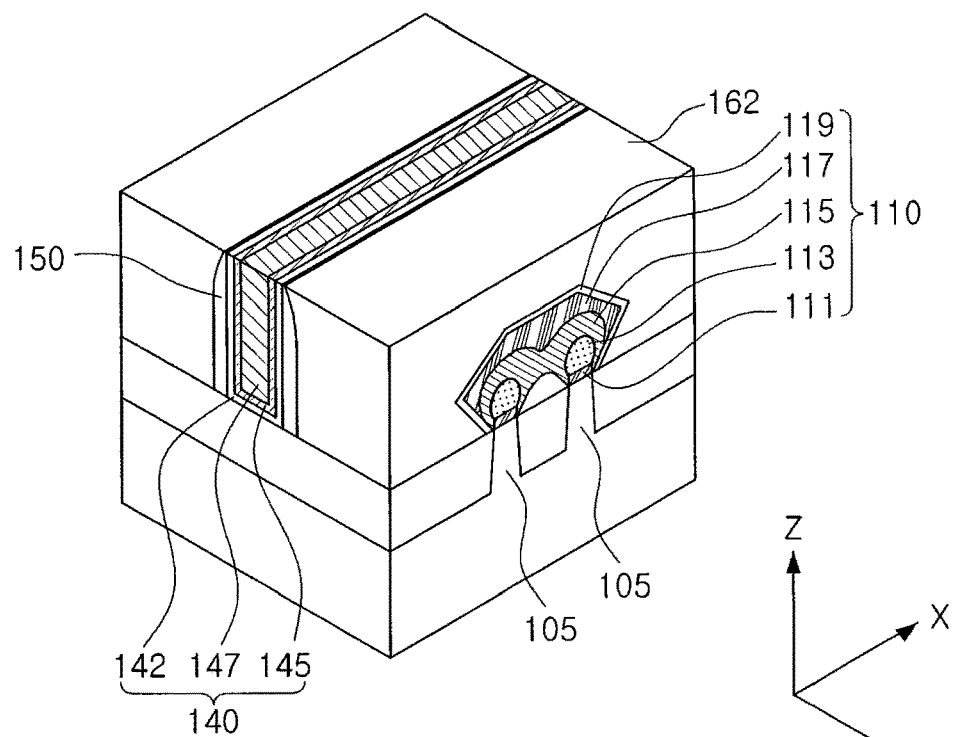
Figure 14:
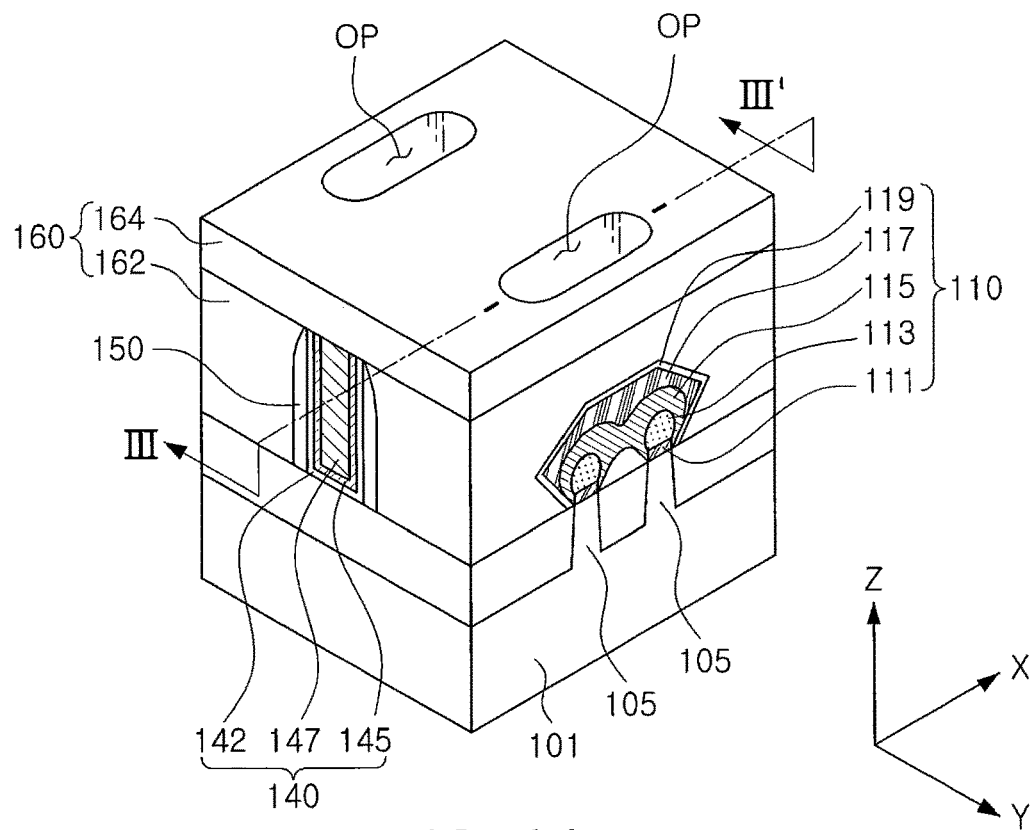
Figure 15:
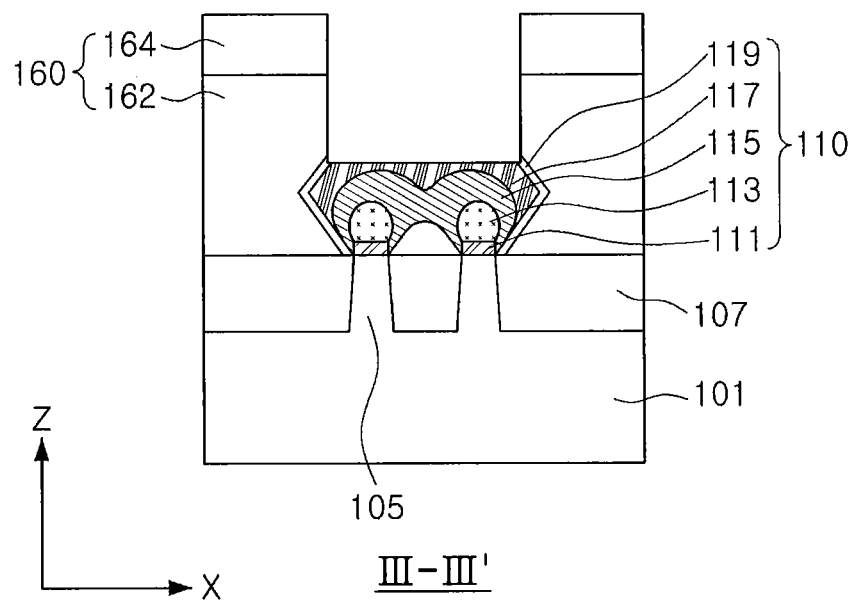

FIGS. 7 to 16 are drawings illustrated according to a process sequence to describe a method of manufacturing a semiconductor device according to example embodiments. FIG. 15 illustrates a cross section cut along line III-III' of FIG. 14.

Figure 7:
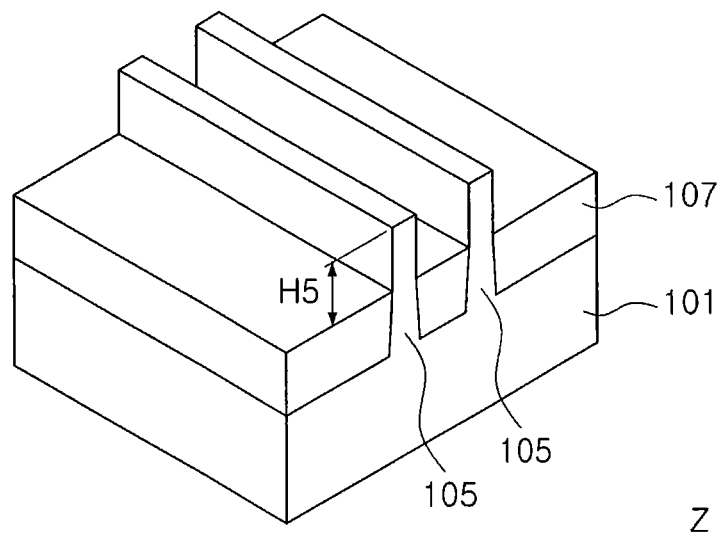
FIGS. 7 to 16 are drawings illustrating a method of manufacturing a semiconductor device according to some embodiments.

Referring to FIG. 7, a substrate 101 is patterned to form active fins 105. Moreover, an element isolation layer 107 covering a lower portion of the active fins 105 may be provided.

A mask pattern is formed on the substrate 101, and the substrate 101 is anisotropically etched using the mask pattern to form trenches defining the active fins 105. The trenches may have a high aspect ratio, and may have a width narrower toward a lower portion. Thus, the active fins 105 may have a width narrower toward an upper portion.

The trenches may be filled with an insulating material and planarizing may be performed. At least a portion of the mask pattern may be removed during the planarizing. In example embodiments, a liner layer, which is relatively thin, is provided in the trenches, and then the trenches may be filled.

A portion of the insulating material that fill the trenches, may be removed, so the active fins 105 may be allowed to protrude from the element isolation layer 107. Thus, the active fins 105 may protrude by a predetermined height H5, and the height H5 of protrusion may be varied.

Figure 8:
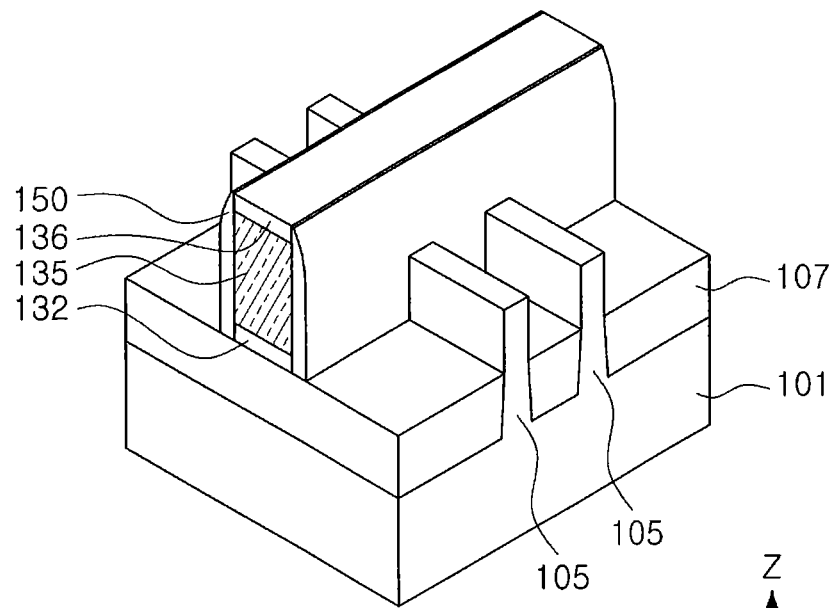

Referring to FIG. 8, a dummy gate insulating layer 132, a dummy gate electrode 135, and a spacer 150, extended while intersecting the active fins 105, may be provided.

The dummy gate insulating layer 132 and the dummy gate electrode 135 may be provided by performing etching using, for example, the mask pattern layer 136.

The dummy gate insulating layer 132 and the dummy gate electrode 135 may be provided in a region in which a gate insulating layer 142 as well as a first gate electrode 145 and a second gate electrode 147 (See FIG. 1) are to be provided, and may be removed in a subsequent process. For example, the dummy gate insulating layer 132 may include a silicon oxide, while the dummy gate electrode 135 may include polysilicon.

The spacer 150 may be provided by anisotropically etching a film, after the film having a uniform thickness is provided on an upper portion of the dummy gate insulating layer 132, the dummy gate electrode 135, and/or the mask pattern layer 136. The spacer 150 may have a structure in which a plurality of films are stacked.

Figure 9:
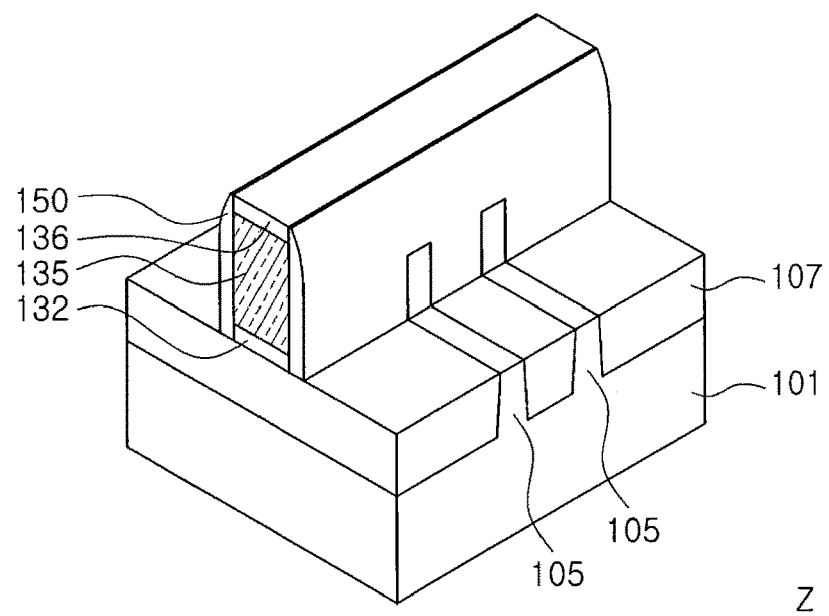

Referring to FIG. 9, an active fin 105 may be selectively removed from both sides of the spacer 150.

A portion of the active fins 105 is removed from the both sides of the spacer 150 to provide recesses. The recesses may be provided by forming a separate mask layer, or by etching a portion of the active fins 105 using the mask pattern layer 136 and the spacer 150 as a mask. The recesses may be provided, for example, by sequentially applying a dry etching process and a wet etching process. Selectively, after the recesses are formed, curing a surface of the active fin 105 may be performed through a separate process. In example embodiments, the upper surface of the active fin 105, having been etched, may be located on a same level as a level of an upper surface of the element isolation layer 107. In example embodiments, the upper surface of the active fin 105, having been etched, may be located higher or lower than the upper surface of the element isolation layer 107.

Before or after formation of the recess, injecting an impurity into the active fin 105 on both sides of the dummy gate electrode 135 may be performed.

Hereinafter, forming the source/drain region 110, described with reference to FIGS. 10 and 11, may be performed using, for example, a selective epitaxial growth (SEG) process.

Figure 10:
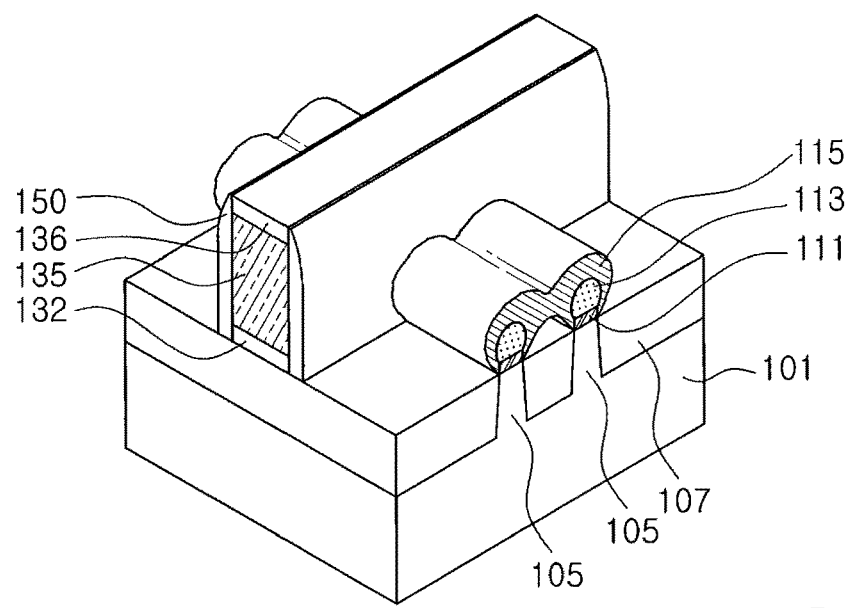

Referring to FIG. 10, first epitaxial layers 111, second epitaxial layers 113, and third epitaxial layers 115 of the source/drain region 110 may be sequentially formed on the active fins 105, having been etched, on both sides of the spacer 150.

As a buffer layer for reducing the occurrence of a defect caused by a difference in lattice constant with the active fins 105, the first epitaxial layers 111, including germanium (Ge) having a first concentration which is relatively low, may be provided. The second epitaxial layers 113 including germanium (Ge) having a second concentration that is higher than the first concentration may be provided on the first epitaxial layers 111. The third epitaxial layers 115 including germanium (Ge) having a third concentration that is higher than the second concentration may be provided on the second epitaxial layers 113. The third epitaxial layers 115 are connected to each other while being grown to provide a single epitaxial layer.

During growth of the first epitaxial layers 111, the second epitaxial layers 113, and the third epitaxial layers 115 of the source/drain region 110, an impurity such as boron (B) may be in-situ doped.

Figure 11:
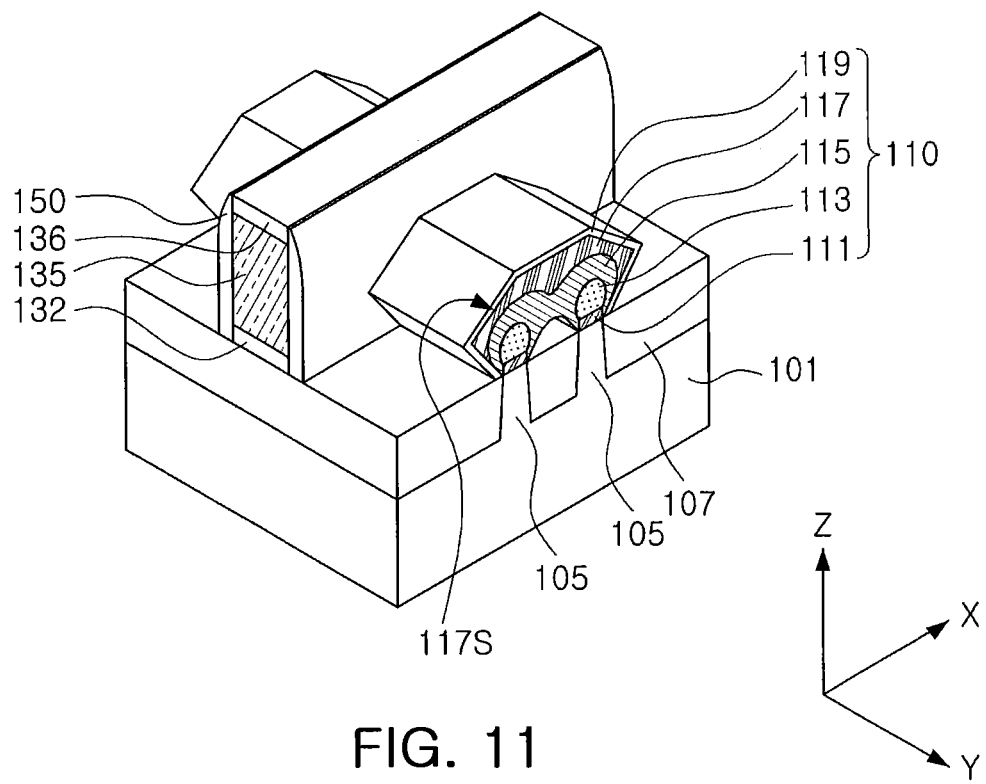

Referring to FIG. 11, a fourth epitaxial layer 117 including germanium (Ge) having a fourth concentration may be provided on the third epitaxial layer 115 of the source/drain region 110.

Side surfaces 117S of the fourth epitaxial layer 117 may be inclined with respect to an upper surface of the substrate 101. The fourth epitaxial layer 117 may include germanium (Ge) having a fourth concentration that is higher than the third concentration of the third epitaxial layer 115. Moreover, the fourth epitaxial layer 117 may include a doping element such as boron (B) having a concentration that is higher than a concentration of the third epitaxial layer 115, but is not limited thereto.

Due to the operation described above, the source/drain region 110, including the first epitaxial layers 111, the second epitaxial layers 113, the third epitaxial layers 115c, and the fourth epitaxial layer 117 as well as a capping layer 119, may be provided.

Figure 12:
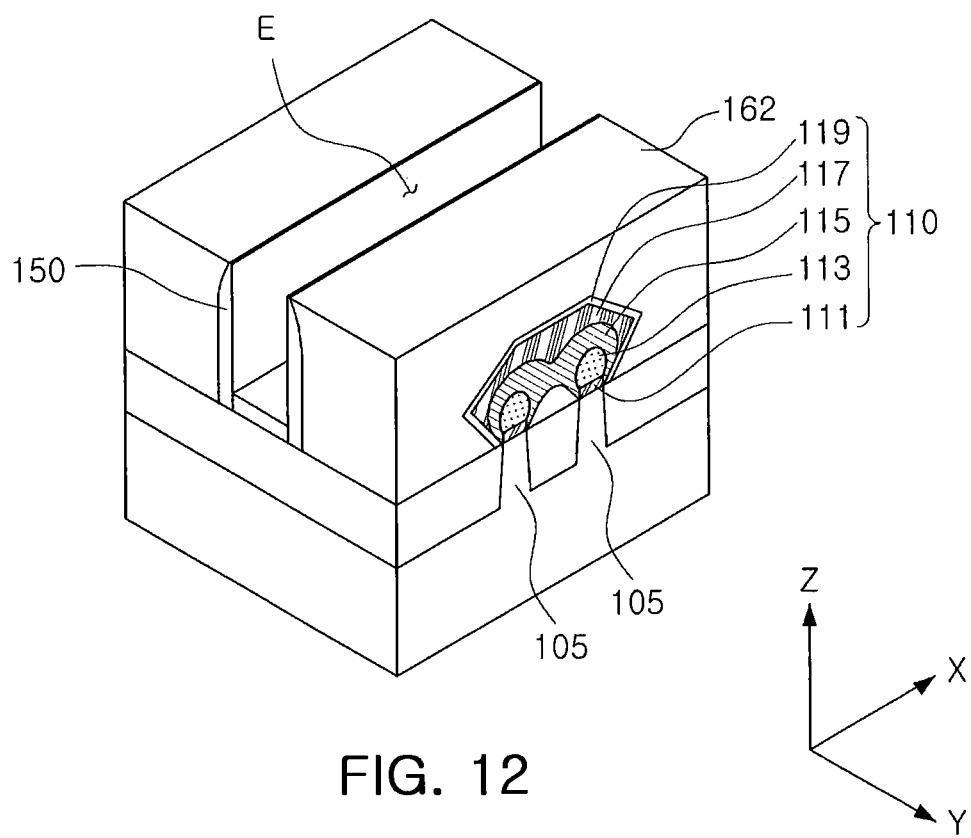

Referring to FIG. 12, a first interlayer insulating layer 162 may be provided on the source/drain region 110.

The first interlayer insulating layer 162 may be provided, by, forming an insulating material layer, covering the mask pattern layer 136, the spacer 150, and the source/drain region 110, and planarizing the insulating material layer to expose an upper surface of the dummy gate electrode 135. Thus, in the operation described above, the mask pattern layer 136 may be removed.

The first interlayer insulating layer 162 may include, for example, at least one among a silicon oxide, a silicon nitride, a silicon oxynitride, or a low-k material.

The dummy gate insulating layer 132 and the dummy gate electrode 135 may be removed. The dummy gate insulating layer 132 and the dummy gate electrode 135 may be removed selectively with respect to the element isolation layer 107 and the active fins 105, so an opening E for exposing the element isolation layer 107 and the active fins 105 may be provided. Removing the dummy gate insulating layer 132 and the dummy gate electrode 135 may be performed using at least one of a dry etching process or a wet etching process.

Referring to FIG. 13, the gate insulating layer 142, a first gate electrode 145 and a second gate electrode 147 may be formed sequentially in the opening E, thereby forming a gate structure 140.

The gate insulating layer 142 is formed substantially conformally along a side wall and a lower surface of the opening E. The gate insulating layer 142 may include a silicon oxide, a silicon nitride, a silicon oxynitride, or a high-k material.

The first gate electrode 145 and the second gate electrode 147 may include a metal, a metal nitride, or a semiconductor material.

Referring to FIGS. 14 and 15, interlayer insulating layers 162 and 164 are patterned to provide a contact hole OP.

The second interlayer insulating layer 164 may be provided. Then, by using a separate mask layer such as a photoresist pattern, the first interlayer insulating layers 162 and the second interlayer insulating layer 164 may be removed from a region in which a contact plug 180 is to be disposed (See FIG. 1). Thus, the contact hole OP may be provided. During removal of the first interlayer insulating layers 162 and the second interlayer insulating layer 164, a portion of the source/drain region 110 may be removed together. Thus, a portion of the source/drain region 110 may be exposed through the contact hole OP.

Figure 16:
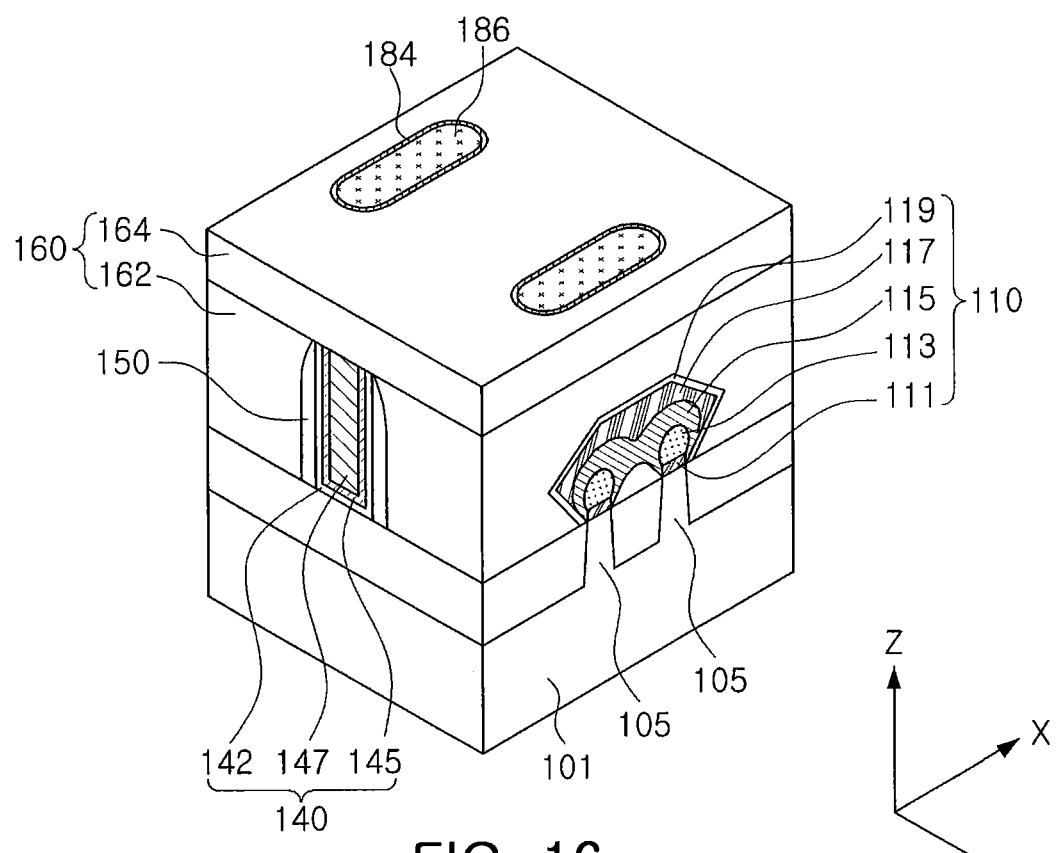

Referring to FIG. 16, a conductive material may be embedded in the contact hole OP to form contact plugs 180.

A first conductive layer 184 and a second conductive layer 186 are sequentially deposited, so the contact hole OP may be embedded thereby. The silicide layer 182 (See FIG. 2A), formed at an interface with the source/drain region 110, may be provided, as a material of the first conductive layer 184 and a material of the source/drain region 110 react with each other, in the operation described above or in a subsequent operation.

Figure 17:
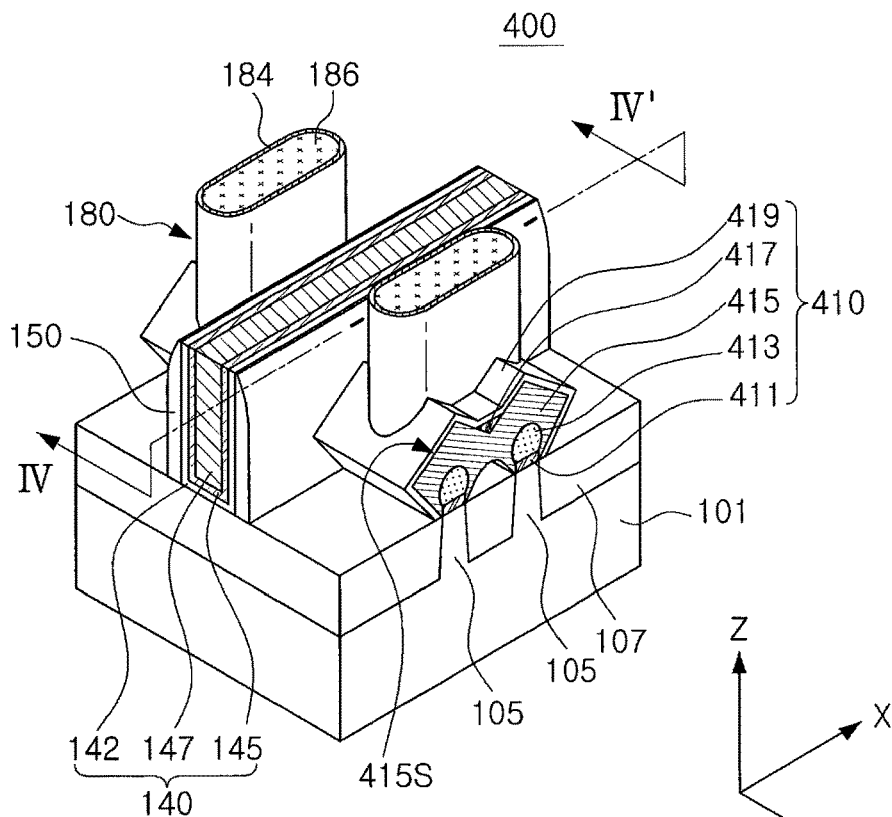
FIGS. 17 and 18 are a perspective view and a cross-sectional view illustrating a semiconductor device according to comparative example embodiments.
Figure 18:
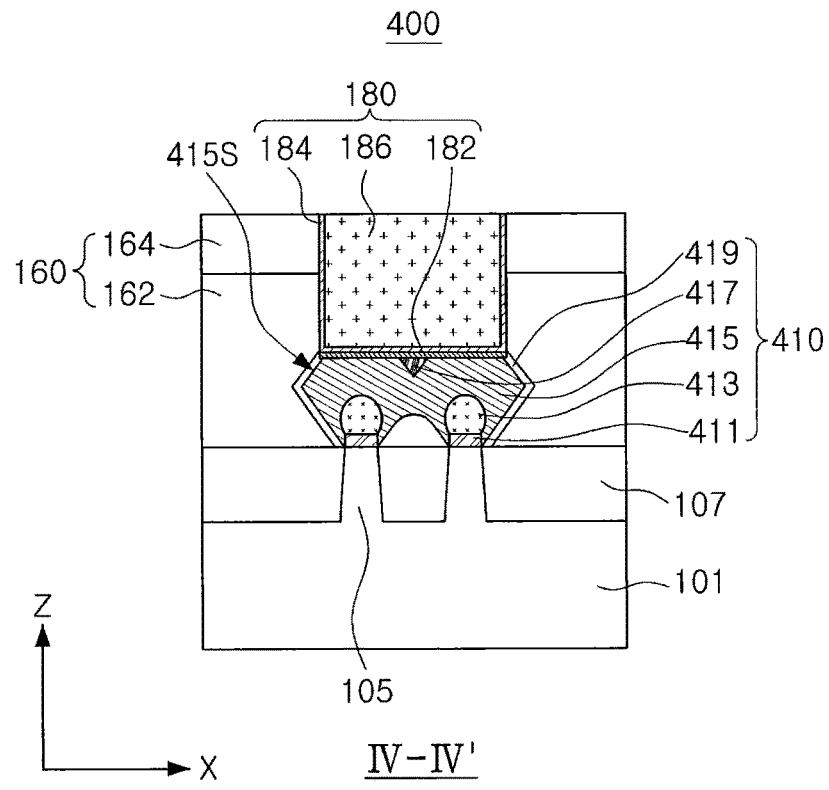

FIGS. 17 and 18 are a perspective view and a cross-sectional view illustrating a semiconductor device according to comparative examples. FIG. 18 illustrates a cross section cut along line IV-IV' of FIG. 17.

Referring to FIGS. 17 and 18, a semiconductor device 400 may include a substrate 101, active fins 105, source/drain regions 410, a gate structure 140, and contact plugs 180. The semiconductor device 400 may further include element isolation layers 107 and spacer 150.

The source/drain regions 410 may be disposed to be connected on two active fins 105. Moreover, each of the source/drain regions 410 may include first epitaxial layers 411, second epitaxial layers 413, third epitaxial layers 415, and a fourth epitaxial layer 417.

The first epitaxial layers 411 are disposed on the active fins 105, while the second epitaxial layers 413 may be disposed on the first epitaxial layers 411. The third epitaxial layers 415 may be grown from the second epitaxial layers 413, and may be connected to each other on the active fins 105. The third epitaxial layers 415 may have surfaces 415S inclined with respect to an upper surface of the substrate 101. The surfaces 415S of the third epitaxial layers 415 may correspond to a crystallographic surface. For example, when the third epitaxial layers 415 are formed of silicon germanium (SiGe), the surfaces 415S of the third epitaxial layers 415 may be a plane, such as a {111} plane.

The fourth epitaxial layer 417 may be disposed on a connection region of the third epitaxial layers 415. The fourth epitaxial layer 417 may be disposed on an inclined surface 415S of the third epitaxial layers 415, opposing each other in a 'V' shape between the third epitaxial layers 415, adjacent to each other. The source/drain regions 410 may further include a capping layer 419 covering the fourth epitaxial layer 417. The capping layer 419 may be disposed to surround an outer surface of the fourth epitaxial layer 417, and the capping layer 419 may protect the fourth epitaxial layer 417 during a subsequent process.

The first epitaxial layers 411, the second epitaxial layers 413, the third epitaxial layers 415, and the fourth epitaxial layer 417 may include elements and/or doping elements, having different concentrations.

For example, the first epitaxial layers 411 may include germanium (Ge) having a first concentration, the second epitaxial layers 413 may include germanium (Ge) having a second concentration, higher than the first concentration, and the third epitaxial layers 415 may include germanium (Ge) having a third concentration, higher than the second concentration. The fourth epitaxial layer 417 may include germanium (Ge) having a fourth concentration, higher than the third concentration.

A lower end of the contact plugs 180 may be simultaneously connected to the third epitaxial layers 415 and the fourth epitaxial layer 417, having different germanium (Ge) concentrations and boron (B) concentrations. As an etching depth varies during formation of a contact hole, a ratio of the third epitaxial layer 415 and the fourth epitaxial layer 417, in contact with the lower end of the contact plugs 180, becomes different, so a change in contact resistance between the contact plugs 180 and the source/drain regions 410 may occur. During formation of a contact hole, when an etching depth is deepened, contact resistance may be increased. On the other hand, when an etching depth is shallow, contact resistance may be reduced.

As set forth above, according to example embodiments of the present inventive concept, a semiconductor device with low contact resistance and improved function may be provided.

Moreover, a semiconductor device with a low change in contact resistance and a low change in function may be provided.

While example embodiments have been shown and described above, it will be apparent to those skilled in the art that modifications and variations could be made without departing from the scope of the present disclosure, as defined by the appended claims.

What is claimed is:

1. A semiconductor device, comprising:
   a plurality of active fins on a substrate;
   a gate electrode on the plurality of active fins; and
   a source/drain region on the plurality of active fins, extending on a first side and a second side of the gate electrode, the source/drain region comprising lower epitaxial layers and an upper epitaxial layer,
   wherein the lower epitaxial layers are on the plurality of the active fins and comprise germanium (Ge) having a first concentration,
   wherein an upper epitaxial layer is on the lower epitaxial layers and comprises germanium (Ge) having a second concentration that is higher than the first concentration, and
   wherein the lower epitaxial layers have convex upper surfaces, and are connected to each other between the active fins.

2. The semiconductor device of claim 1,
   wherein the upper epitaxial layer comprises inclined side surfaces with respect to an upper surface of the substrate,
   wherein an upper portion of the upper epitaxial layer overlaps the lower epitaxial layers that are connected to each other.

3. The semiconductor device of claim 2, wherein the upper epitaxial layer has an upper surface which is flat and is between the inclined side surfaces.

4. The semiconductor device of claim 2, wherein the upper epitaxial layer has an upper surface which is concave and is between the inclined side surfaces.

5. The semiconductor device of claim 2,
   wherein the upper epitaxial layer has a groove between the inclined side surfaces, and
   wherein the upper epitaxial layer has protruding portions which are pointed.

6. The semiconductor device of claim 1,
   wherein the source/drain region comprises silicon and germanium,
   wherein the first concentration of germanium is in a range of 45 atomic percentage (at %) to 60 at %, and
   wherein the second concentration of germanium is in a range of 60 at % to 90 at %.

7. The semiconductor device of claim 1, further comprising:
   a contact plug on the source/drain region,
   wherein the contact plug is in contact with the upper epitaxial layer.

8. The semiconductor device of claim 7, wherein the contact plug comprises a silicide layer that physically contacts the source/drain region.

9. The semiconductor device of claim 1,
   wherein the plurality of active fins have a recessed area on the first side and the second side of the gate electrode, and
   wherein the source/drain region is in the recessed area.

10. The semiconductor device of claim 1, wherein the upper epitaxial layer comprises a dopant having a third concentration that is higher than a fourth concentration of the dopant in the lower epitaxial layers.

11. The semiconductor device of claim 1, further comprising:
    an air gap between the source/drain regions,
    wherein the air gap is between the lower epitaxial layers and an element isolation layer that is on the substrate.

12. The semiconductor device of claim 1,
    wherein the source/drain region further comprises a capping layer on the upper epitaxial layer, and
    wherein the capping layer comprises silicon (Si).

13. A semiconductor device, comprising:
    a plurality of active fins on a substrate;
    a gate electrode on the plurality of active fins; and
    a source/drain region on the plurality of active fins, extending on a first side and a second side of the gate electrode, the source/drain region comprising first epitaxial layers, second epitaxial layers, third epitaxial layers, and a fourth epitaxial layer,
    wherein the first epitaxial layers are on ones of the plurality of active fins, and comprise germanium (Ge) having a first concentration,
    wherein the second epitaxial layers are on the first epitaxial layers, and comprise germanium (Ge) having a second concentration that is higher than the first concentration, wherein the third epitaxial layers are on the second epitaxial layers, and comprise germanium (Ge) having a third concentration that is higher than the second concentration, wherein the fourth epitaxial layer comprises germanium (Ge) having a fourth concentration that is higher than the third concentration, wherein the fourth epitaxial layer is on the third epitaxial layers, and wherein the third epitaxial layers have convex upper surfaces, and are connected to each other between the ones of the plurality of active fins.

14. The semiconductor device of claim 13, wherein the fourth epitaxial layer comprises inclined side surfaces with respect to a first upper surface of the substrate, and wherein the fourth epitaxial layer further comprises a second upper surface which is flat or concave between the inclined side surfaces.

15. The semiconductor device of claim 13, wherein the fourth epitaxial layer comprises inclined side surfaces with respect to a first upper surface of the substrate, and wherein the fourth epitaxial layer further comprises a groove between the inclined side surfaces.

16. The semiconductor device of claim 13, wherein the source/drain region comprises silicon and germanium, wherein the first concentration of germanium is in a range of 5 atomic percentage (at %) to 25 at %, wherein the second concentration of germanium is in a range of 25 at % to 45 at %, wherein the third concentration of germanium is in a range of 45 at % to 60 at %, and wherein the fourth concentration of germanium is in a range of 60 at % to 90 at %.

17. The semiconductor device of claim 13, further comprising:

a contact plug on the source/drain region, and in contact with the fourth epitaxial layer.

18. The semiconductor device of claim 13, wherein the first epitaxial layers, the second epitaxial layers, the third epitaxial layers, and the fourth epitaxial layer comprise boron (B) having different concentrations.

19. The semiconductor device of claim 13, wherein the source/drain region further comprises a capping layer on the fourth epitaxial layer, and wherein the capping layer is formed of silicon (Si).

20. A semiconductor device, comprising:

a plurality of active fins on a substrate;

a gate electrode on the plurality of active fins;

a source/drain region on the plurality of active fins, extending on a first side and a second side of the gate electrode; and a contact plug on the source/drain region, wherein the source/drain region comprises first epitaxial layers, second epitaxial layers, third epitaxial layers, and a fourth epitaxial layer, wherein the first epitaxial layers are on ones of the plurality of active fins, and comprise germanium (Ge) having a first concentration, wherein the second epitaxial layers are on the first epitaxial layers, and comprise germanium (Ge) having a second concentration that is higher than the first concentration, wherein the third epitaxial layers are on the second epitaxial layers, and comprise germanium (Ge) having a third concentration that is higher than the second concentration, wherein the fourth epitaxial layer comprises germanium (Ge) having a fourth concentration that is higher than the third concentration, wherein the fourth epitaxial layer is on the third epitaxial layers, wherein the third epitaxial layers have convex upper surfaces, and are connected to each other between the ones of the plurality of active fins, and wherein the contact plug is in contact with the fourth epitaxial layer.

* * * * *